United States Patent
Yamamoto

(10) Patent No.: US 11,271,340 B2
(45) Date of Patent: Mar. 8, 2022

(54) CONNECTOR UNIT WITH TERMINAL BLOCK

(71) Applicant: Yazaki Corporation, Tokyo (JP)

(72) Inventor: Shohei Yamamoto, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/409,020

(22) Filed: May 10, 2019

(65) Prior Publication Data

US 2019/0348792 A1    Nov. 14, 2019

(30) Foreign Application Priority Data

May 11, 2018   (JP) .............................. JP2018-092099

(51) Int. Cl.
   *H01R 12/58*    (2011.01)
   *H01R 13/502*   (2006.01)
   *H01R 13/41*    (2006.01)

(52) U.S. Cl.
   CPC ........... *H01R 13/502* (2013.01); *H01R 12/58* (2013.01); *H01R 13/41* (2013.01)

(58) Field of Classification Search
   CPC .. H01R 13/516; H01R 13/502; H01R 13/506; H01R 13/58; H01R 13/582; H01R 13/533; H01R 13/41; H01R 13/42; H01R 12/55; H01R 12/57; H01R 12/58; H01R 12/515; H01R 12/70; H01R 12/7011; H01R 12/7017; H01R 12/7023; H01R 12/7029; H01R 12/71; H01R 12/725; H01R 12/7047; H01R 12/707; H01R 25/006; H05K 5/0039; H05K 5/0069; H05K 5/00; H05K 5/0004; H05K 5/0026; H05K 5/006; H05K 5/0056; H05K 5/0047; H05K 5/0052; H05K 7/14; H05K 7/1421; B60R 16/0239
   USPC .................................. 439/597, 76, 695, 474
   See application file for complete search history.

(56) References Cited

U.S. PATENT DOCUMENTS

| | | | | |
|---|---|---|---|---|
| 4,884,335 A | * | 12/1989 | McCoy | H05K 3/34 29/839 |
| 4,900,267 A | * | 2/1990 | Nagasaka | H01R 13/641 439/489 |
| 4,968,263 A | * | 11/1990 | Silbernagel | H01R 13/6315 439/246 |
| 5,076,796 A | * | 12/1991 | Kusayanagi | H05K 3/308 439/83 |

(Continued)

FOREIGN PATENT DOCUMENTS

| | | |
|---|---|---|
| EP | 1610601 A1 | 12/2005 |
| EP | 2160802 | 3/2010 |

(Continued)

*Primary Examiner* — Edwin A. Leon
*Assistant Examiner* — Milagros JeanCharles
(74) *Attorney, Agent, or Firm* — Sughrue Mion, PLLC

(57) ABSTRACT

A connector unit includes: a housing including a guide rail inside the housing; a terminal block including a flange and configured to hold a terminal having one end exposed in an opening of the housing, the terminal block being housed inside the housing with the flange supported by the guide rail; and a board connected with the other end of the terminal and housed in the housing with the board suspended from the terminal block through the terminal.

6 Claims, 3 Drawing Sheets

(56) References Cited

U.S. PATENT DOCUMENTS

| | | | | |
|---|---|---|---|---|
| 5,174,776 A * | 12/1992 | Ohtaka | | H01R 13/641 439/188 |
| 5,178,553 A * | 1/1993 | Hatagishi | | H01R 13/62933 439/157 |
| 5,441,427 A * | 8/1995 | Yamada | | H01R 13/4367 439/686 |
| 5,960,537 A * | 10/1999 | Vicich | | H01R 43/205 29/843 |
| 7,140,885 B2 * | 11/2006 | Kitamura | | H05K 5/0039 439/76.1 |
| 7,419,385 B2 * | 9/2008 | Itou | | H01R 23/70 439/76.1 |
| 7,597,581 B2 * | 10/2009 | Trout | | H01R 13/633 439/474 |
| 2001/0017767 A1 * | 8/2001 | Kitamura | | H05K 5/0039 361/752 |
| 2007/0015386 A1 * | 1/2007 | Sakamoto | | H01R 12/725 439/79 |
| 2007/0049072 A1 | 3/2007 | Sato | | |
| 2009/0209130 A1 * | 8/2009 | Kameyama | | H01R 23/6873 439/607.27 |
| 2014/0194012 A1 * | 7/2014 | Akagi | | H01R 13/4362 439/701 |
| 2016/0020548 A1 * | 1/2016 | Takamura | | H01R 13/5202 439/587 |
| 2016/0353563 A1 * | 12/2016 | Morimoto | | H05K 5/0026 |
| 2017/0069984 A1 * | 3/2017 | Miura | | H01R 12/724 |
| 2018/0123266 A1 * | 5/2018 | Endo | | H01R 13/46 |
| 2018/0370359 A1 * | 12/2018 | Ohyama | | B60K 35/00 |
| 2018/0370460 A1 * | 12/2018 | Ohyama | | B60R 16/0207 |
| 2019/0297737 A1 * | 9/2019 | Kawamura | | H05K 5/0039 |
| 2019/0306998 A1 * | 10/2019 | Malecke | | H05K 5/0069 |

FOREIGN PATENT DOCUMENTS

| | | |
|---|---|---|
| EP | 2445325 A2 | 4/2012 |
| JP | 6-52913 A | 2/1994 |
| JP | 9-283196 A | 10/1997 |
| JP | 2011070853 A | 4/2011 |
| JP | 2018-033196 A | 3/2018 |
| WO | 2008144197 A1 | 11/2008 |

* cited by examiner

CONNECTOR UNIT WITH TERMINAL BLOCK

CROSS REFERENCE TO RELATED APPLICATION

This application is based upon and claims the benefit of priority from the prior Japanese Patent Application No. 2018-092099, filed on May 11, 2018, the entire contents of which are incorporated herein by reference.

BACKGROUND

1. Technical Field

The disclosure relates to a connector unit in which a terminal block holding a terminal of a connector is fixed to a board.

2. Related Art

Japanese Patent Laid-open No. 2018-33196 discloses a connector unit in which a terminal of a connector is connected with a board. In the connector unit, a terminal block holding the terminal is screwed to the board, the terminal is inserted into a through-hole of the board and soldered, and then the board is housed in a housing. In the connector unit, when the board is housed in the housing, the terminal is arranged in an opening of the housing into which another connector is inserted.

SUMMARY

When such a connector unit thus configured is assembled, the terminal block cannot be screwed to the board while the board is housed in the housing. Thus, the terminal block together with any other component needs to be mounted on the board yet to be housed in the housing by using a variant mounter, and after screwing, the terminal of the terminal block and the other component need to be soldered to the board by local flow.

However, the screwing of the terminal block to the board requires costs for screws. Moreover, the screws are required to be avoided when the terminal and the other component are soldered by local flow. These requirements lead to increase in a component cost, a manufacture process, and a manufacturing facility, and causes product cost increase. To avoid these increases, the screwing of the terminal block to the board may be eliminated.

However, when the terminal block is not directly fixed to the board and external force is applied to the board before the terminal is fixed by soldering, the terminal block is potentially inclined so that the terminal is not arranged in an opening of the housing. In addition, solder potentially solidifies while the terminal block is separated from the board due to the surface tension of solder, which results in insufficient fixation of the terminal block to the board.

In addition, since the terminal block is fixed to the board only by soldering the terminal to the board, stress concentrates on a soldering place of the terminal when the connector unit after assembly is engaged with the corresponding connector. In addition, when a wire harness continuous with the corresponding connector engaged with the connector unit is deflected due to vibration, stress concentrates on the soldering place of the terminal. Accordingly, the stress applied to the soldering place potentially generates cracks of the solder and causes defect of the state of conduction between the board and the terminal at the soldering place.

The disclosure is directed to a connector unit that can prevent stress from concentrating on a connection place between a terminal of a terminal block and a board without employing a structure in which the terminal block is directly fixed to the board, which leads to increase in a product cost.

A connector unit in accordance with some embodiments includes: a housing including a guide rail inside the housing; a terminal block including a flange and configured to hold a terminal having one end exposed in an opening of the housing, the terminal block being housed inside the housing with the flange supported by the guide rail; and a board connected with the other end of the terminal and housed in the housing with the board suspended from the terminal block through the terminal.

With the above-described configuration, the flange of the terminal block is supported by the guide rail in the housing when the board connected with the other end of the terminal held by the terminal block is housed in the housing together with the terminal block.

Accordingly, in the housing, the terminal block is positioned relative to the housing. In addition, the board does not have direct contact with the housing, but is suspended in the housing through the terminal of the terminal block.

Accordingly, stress applied to the terminal block when the corresponding connector is engaged with the connector unit applies to the flange of the terminal block supported by the guide rail, but does not directly apply to the connection place between the other end of the terminal of the terminal block and the board.

In addition, stress applied to the terminal block when a wire harness continuous with the corresponding connector engaged with the connector unit is deflected due to vibration does not directly apply to the connection place between the other end of the terminal of the terminal block and the board.

Accordingly, it is possible to achieve a configuration with which stress applied to the terminal block does not concentrate on the connection place of the other end of the terminal through the board.

In addition, the terminal block has connection with the housing through the flange and the guide rail, but the board connected with the other end of the terminal of the terminal block does not have connection with the housing.

Accordingly, in soldering to connect the terminal with the board, no problem occurs to the assembly state of the connector unit when solder solidifies while the terminal block is separated from the board due to the surface tension of solder, and the terminal block cannot be fixed to the board.

Accordingly, the terminal block does not need to be directly fixed to the board, and a member for fastening the board and the terminal block is not needed. When no fastening member is needed, the other end of the terminal does not need to be soldered to the board by local flow while avoiding the fastening member. In addition, mounting of the terminal block and any other component on the board can be performed all at once by a mounter.

Thus, it is possible to achieve a configuration with reduced increase in a component cost, a manufacturing process, and a manufacturing facility, which leads to increase in a product cost of the connector unit.

Accordingly, stress can be prevented from concentrating on the connection place between the terminal of the terminal block and the board without employing a structure in which the terminal block is directly fixed to the board, which leads to increase in a product cost.

The terminal block may further include: a contact portion in contact with a mounting surface of the board; a positioning protrusion protruding in parallel to the other end of the terminal from the contact portion and inserted into the board at an insertion length longer than the other end of the terminal; and a leg piece extending from the contact portion and contacting a place adjacent to a contact place of the contact portion on the mounting surface with the positioning protrusion inserted into the board.

With the above-described configuration, when the terminal block of the connector unit is assembled to the board, the positioning protrusion is inserted into the board before the other end of the terminal of the terminal block, and the terminal block is positioned relative to the mounting surface of the board. Thus, the other end of the terminal is accurately inserted into a through-hole of the board.

After the positioning protrusion is inserted into the board, the leg piece of the terminal block, together with the contact portion, contacts the mounting surface of the board to prevent inclination of the terminal block on the board. Thus, the terminal can be prevented from being connected (for example, soldered) with the board at an anomalous position while the terminal block is inclined.

In addition, after the other end of the terminal is connected (for example, soldered) with the board, movement of the terminal block in the mounting surface of the board is regulated in the range of clearance between a place at which the positioning protrusion is inserted on the board and the positioning protrusion.

Thus, the terminal block can be positioned at a correct mounting place on the mounting surface of the board before and after the connection of the other end of the terminal of the terminal block with the board.

DETAILED DESCRIPTION

Figure 1:
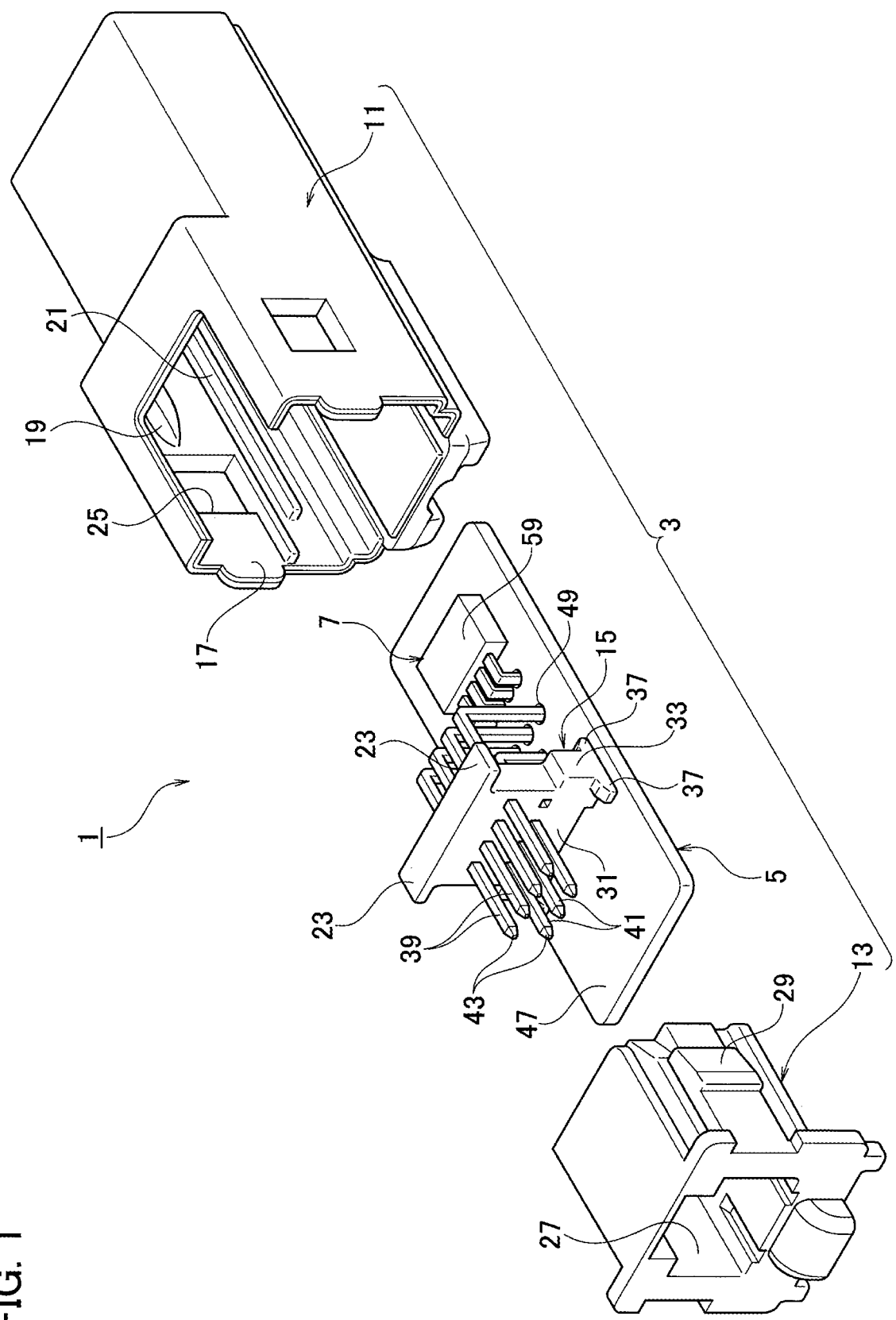
FIG. 1 is an exploded perspective view illustrating a schematic configuration of a connector unit according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Description will be hereinbelow provided for embodiments of the present invention by referring to the drawings. It should be noted that the same or similar parts and components throughout the drawings will be denoted by the same or similar reference signs, and that descriptions for such parts and components will be omitted or simplified. In addition, it should be noted that the drawings are schematic and therefore different from the actual ones.

The following describes an embodiment of the present invention with reference to the accompanying drawings. FIG. 1 is an exploded perspective view illustrating a schematic configuration of a connector unit 1 according to the embodiment of the present invention.

The connector unit 1 according to the present embodiment illustrated in FIG. 1 is installed on a vehicle (not illustrated). The connector unit 1 performs, through a shared connector, inputting of a control signal for a load (not illustrated), which is output from a higher-level controller (not illustrated), and outputting of a drive signal for the load, which is generated inside from the control signal.

The connector unit 1 includes a male connector 3, a circuit board 5 (board), and a controller 7.

The male connector 3 includes a housing 11, a front cover 13, and a terminal block 15 housed inside the housing 11.

The housing 11 is made of a hollow box having an opening 17 at a front surface. The circuit board 5 on which the terminal block 15 and the like are mounted is housed inside the housing 11. An upper guide rail 19 and a lower guide rail 21 are provided as extensions on each of both side walls in the housing 11.

Each upper guide rail 19 (guide rail) guides a flange 23 (to be described later) provided to the terminal block 15 on the circuit board 5 housed in the housing 11. The lower guide rails 21 guide both sides of the circuit board 5 housed in the housing 11. Lock holes 25 are formed at positions closer to the opening 17 on both side surfaces of the housing 11.

The front cover 13 is attached to the opening 17 of the housing 11. The front cover 13 has an insertion hole 27 penetrating through the front cover 13. While the front cover 13 is attached to the opening 17 of the housing 11, a female connector (not illustrated) corresponding to the connector unit 1 is inserted into the insertion hole 27. The front cover 13 is inserted inside through the opening of the housing 11 in a direction in which the corresponding female connector is inserted into the insertion hole 27.

Lock pieces 29 are provided on both side surfaces of the front cover 13. When the front cover 13 is inserted into the housing 11, the lock pieces 29 are locked to the lock holes 25 of the housing 11, and the front cover 13 is attached to the opening 17 of the housing 11.

Figure 2:
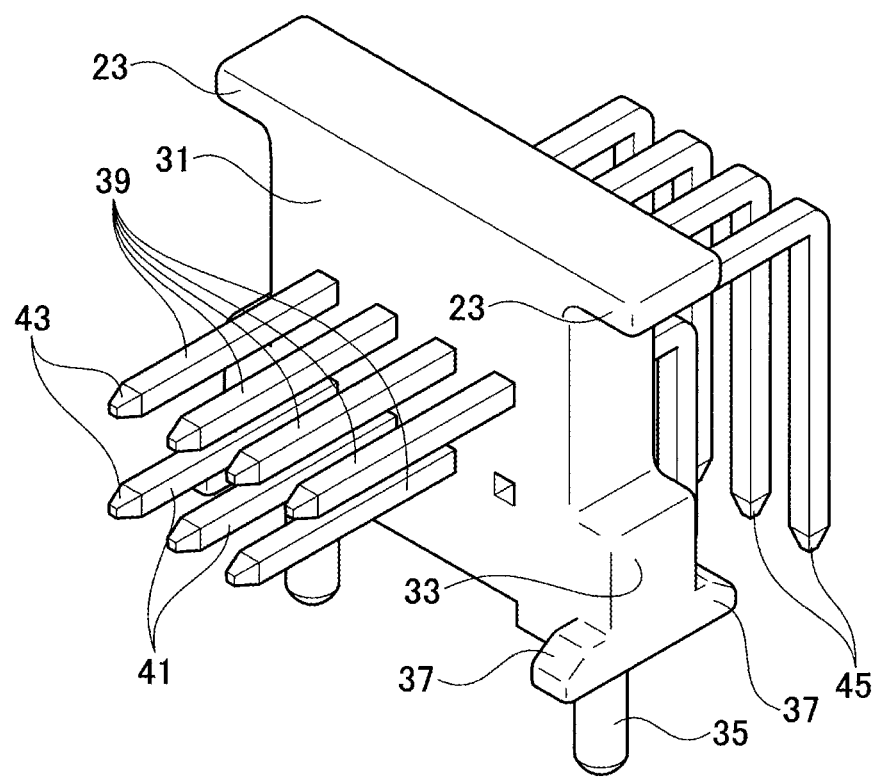
FIG. 2 is an enlarged perspective view of the terminal block in FIG. 1.

As illustrated in an enlarged perspective view in FIG. 2, the terminal block 15 includes a terminal holder 31, a contact portion 33, a positioning pin 35, and a leg piece 37 as well as the flange 23 described above.

The terminal holder 31 is formed in a rectangular flat plate shape, and holds leading end 43 (terminal end) sides of a plurality of male terminals 39 and 41 (terminals) penetrating in the front-rear direction. Each male terminal 39 is a terminal for inputting a control signal for a load, and each male terminal 41 is a terminal for outputting a drive signal for the load.

Base end 45 (other terminal end) sides of the male terminals 39 and 41 are bent at places opposite to the leading end 43 sides of the male terminals 39 and 41 through the terminal holder 31. As illustrated in a side view in FIG. 3, the base end 45 of each bent male terminal 39 or 41 is inserted into a through-hole 49 penetrating the circuit board 5 from a mounting surface 47 side on which the terminal block 15 and the like are mounted, and is soldered to a back surface 51 of the circuit board 5.

When the circuit board 5 is housed in the housing 11, the leading ends 43 of the male terminals 39 and 41 extend inside the insertion hole 27 of the front cover 13 attached to the opening 17 of the housing 11 illustrated in FIG. 1. Then, the leading end 43 of each male terminal 39 or 41 is connected with a female terminal (not illustrated) of the corresponding female connector inserted into the insertion hole 27 and connected with the male connector 3.

The base ends 45 of the male terminals 39 and 41 of the male connector 3 are connected with the controller 7 (to be described later; refer to FIG. 2) on the circuit board 5 through a wiring pattern (not illustrated) of the circuit board 5.

The contact portions 33 are formed at right and left bottom corners of the terminal holder 31. Each contact portion 33 has a contact surface 53 that contacts the mounting surface 47 of the circuit board 5 at a lower end.

Figure 3:
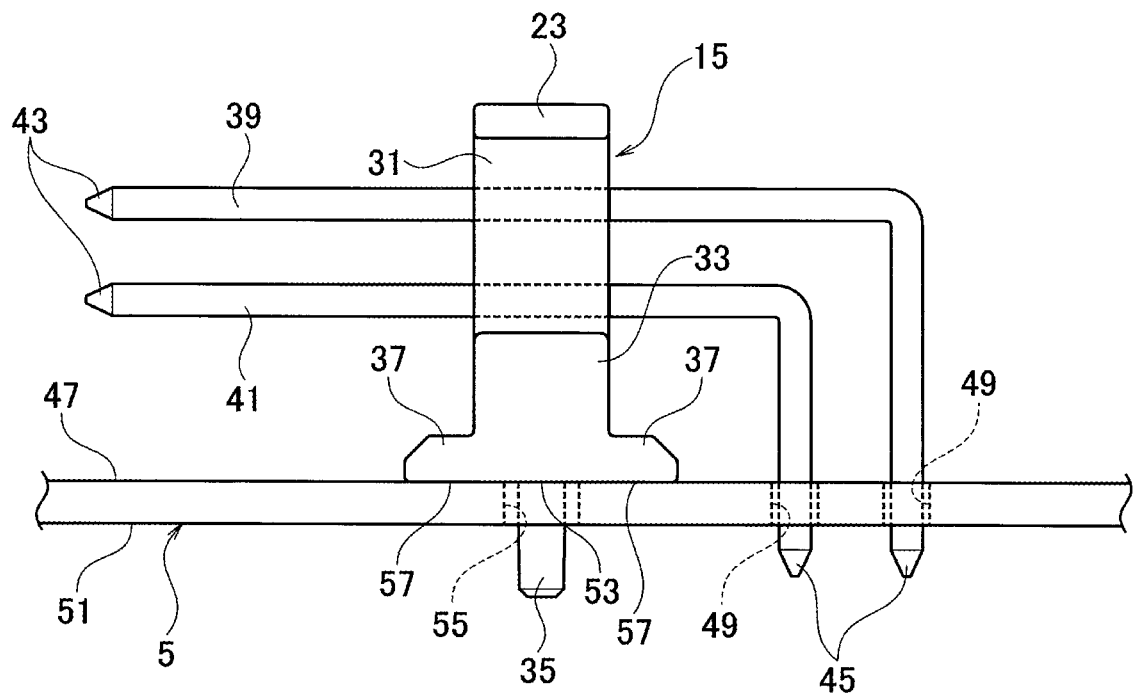
FIG. 3 is a side view of a main part of a circuit board, illustrating a state in which the terminal block in FIG. 1 is mounted.

The positioning pin 35 (positioning protrusion) is provided as an extension from the contact surface 53 of each contact portion 33. As illustrated in FIG. 3, the positioning pin 35 has a leading end positioned lower than the base ends 45 of the male terminals 39 and 41. Specifically, the positioning pin 35 is provided as an extension in parallel to the base end 45 sides of the male terminals 39 and 41, and inserted into a positioning hole 55 of the circuit board 5 at an insertion length longer than the base ends 45 of the male terminals 39 and 41.

The leg piece 37 is extended in the front-rear direction from a lower end of each contact portion 33, and has a contact surface 57 continuous with the contact surface 53 of the contact portion 33 in the front-rear direction. The contact surface 57 of the leg piece 37 contacts a place continuous with, in the front-rear direction, a place in contact with the contact surface 53 of the contact portion 33 on the mounting surface 47 of the circuit board 5.

Figure 4:
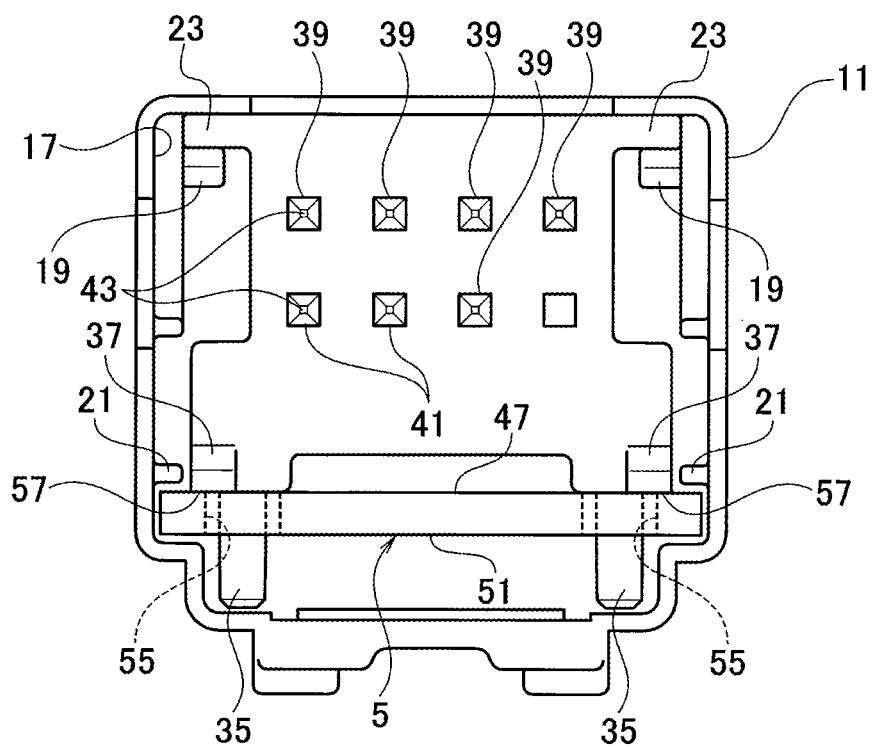
FIG. 4 is a front view of a housing in which a circuit board in FIG. 1 is housed when viewed from an opening side, illustrating a state in which the terminal block is supported inside the housing.

The flanges 23 are provided as lateral extensions from right and left top corners of the terminal holder 31. Each flange 23 is inserted between the top plate of the housing 11 and the upper guide rail 19 as illustrated in a front view in FIG. 4 when the circuit board 5 with the terminal block 15 mounted on the mounting surface 47 is housed into the housing 11 from the opening 17 side. Both sides of the circuit board 5 are inserted below the lower guide rails 21 of the housing 11.

Each flange 23 inserted between the top plate of the housing 11 and the upper guide rail 19 on the side wall is supported by the upper guide rail 19. In this state, upward movement of the terminal block 15 and the circuit board 5 exceeding an allowable range relative to the housing 11 is regulated by the lower guide rails 21 arranged above both sides of the circuit board 5.

The controller 7 illustrated in FIG. 1 is achieved by, for example, an IC 59 mounted on the circuit board 5, and includes a CPU, a ROM, a RAM, and the like. The controller 7 generates a drive signal for operating a load based on a load control signal input from a higher-level controller (not illustrated) through the male connector 3. The controller 7 outputs the generated drive signal to each male terminal 41 of the male connector 3.

When the connector unit 1 thus configured is assembled, first, the positioning pin 35 is inserted into the positioning hole 55 of the circuit board 5 before the base ends 45 of the male terminals 39 and 41 of the terminal block 15 are inserted into the through-holes 49.

When the positioning pin 35 is inserted into the positioning hole 55, the terminal block 15 is positioned relative to the mounting surface 47 of the circuit board 5. Thus, the base ends 45 of the male terminals 39 and 41 can be accurately inserted into the through-holes 49 of the circuit board 5.

After the positioning pin 35 is inserted into the positioning hole 55, the contact surfaces 57 of the leg pieces 37 of the terminal block 15, together with the contact surfaces 53 of the contact portions 33, contact the mounting surface 47 of the circuit board 5 to prevent inclination of the terminal block 15 on the circuit board 5. Thus, the base ends 45 of the male terminals 39 and 41 can be prevented from being soldered to the through-holes 49 of the circuit board 5 at anomalous positions while the terminal block 15 is inclined.

After the base ends 45 of the male terminals 39 and 41 are soldered to the through-holes 49 of the circuit board 5, movement of the terminal block 15 relative to the mounting surface 47 of the circuit board 5 is regulated within the range of clearance between the positioning pin 35 and the positioning hole 55 of the circuit board 5.

Thus, the terminal block 15 can be positioned at a correct place on the mounting surface 47 of the circuit board 5 before and after the soldering of the base ends 45 of the male terminals 39 and 41 to the through-holes 49 of the circuit board 5.

When the circuit board 5 with the terminal block 15 mounted on the mounting surface 47 in this manner is housed into the housing 11 through the opening 17, the flanges 23 provided as extensions at the right and left top corners of the terminal holder 31 of the terminal block 15 are supported by the upper guide rails 19 on both side walls of the housing 11, respectively.

Accordingly, the terminal block 15 is positioned in the housing 11. In this state, the circuit board 5 is not in contact with the lower guide rails 21 of the housing 11, and thus is suspended in the housing 11 through the male terminals 39 and 41 of the terminal block 15.

With this configuration, stress generated when vibration is applied to the housing 11 is applied to the flanges 23 of the terminal block 15 supported by the upper guide rails 19. Thus, the stress generated when vibration is applied to the housing 11 is not directly applied to the soldering places between the base ends 45 of the male terminals 39 and 41 of the terminal block 15 and the through-holes 49 of the circuit board 5.

This achieves a configuration with which the stress generated when vibration is applied to the housing 11 does not concentrate at the soldering places of the base ends 45 of the male terminals 39 and 41 through the circuit board 5.

The terminal block 15 has mechanical connection with the housing 11 through the flanges 23 and the upper guide rails 19. However, the circuit board 5, in which the base ends 45 of the male terminals 39 and 41 of the terminal block 15 are soldered to the through-holes 49, does not have mechanical connection with the housing 11.

Thus, in soldering to connect the male terminals 39 and 41 with the circuit board 5, no problem occurs to the assembly state of the connector unit 1 when solder solidifies while the terminal block 15 is separated from the mounting surface 47 of the circuit board 5 due to the surface tension of the solder, and the terminal block 15 cannot be fixed to the circuit board 5 through the soldering.

In addition, when the terminal block 15 is separated from the mounting surface 47 of the circuit board 5 due to the surface tension of solder and the positional relation therebetween is shifted from a correct positional relation, the circuit board 5 on which the terminal block 15 is mounted can be housed in the housing 11 while the shift is allowed in the range of clearance between the circuit board and each of the inner wall of the housing 11 and the lower guide rails 21.

Accordingly, the terminal block 15 does not need to be directly fixed to the circuit board 5, and a member (such as a screw) for fastening the circuit board 5 and the terminal block 15 is not needed. When no fastening member is needed, the base ends 45 of the male terminals 39 and 41 do not need to be soldered to the through-holes 49 of the circuit board 5 by local flow while avoiding the fastening member. In addition, mounting of the terminal block 15 on the circuit board 5 and mounting of the controller 7 and any other component on the mounting surface 47 can be performed all at once by a mounter.

Thus, it is possible to achieve a configuration with reduced increase in a component cost, a manufacturing process, and a manufacturing facility, which leads to increase in the product cost of the connector unit 1.

According to the connector unit 1, it is possible to prevent stress generated when vibration is applied to the housing 11 from concentrating on the soldering places between the base ends 45 of the male terminals 39 and 41 and the through-holes 49 of the circuit board 5 without employing a structure in which the terminal block 15 is directly fixed to the circuit board 5, which leads to increase in a product cost.

In the present embodiment, the lower guide rails 21 of the housing 11 are arranged above both sides of the circuit board 5 housed in the housing 11. However, the lower guide rails 21 may be arranged below both sides of the circuit board 5 housed in the housing 11.

With this configuration, the lower guide rails 21 can regulate downward movement of the terminal block 15 and the circuit board 5 relative to the housing 11, exceeding the allowable range. Alternatively, the lower guide rails 21 of the housing 11 may be omitted.

In addition, although the present embodiment exemplarily describes the connector unit 1 installed on a vehicle, the present invention is widely applicable to a connector unit in which a terminal block holding a terminal of a connector is fixed to a board and that is installed at a place other than a vehicle.

Embodiments of the present invention have been described above. However, the invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

Moreover, the effects described in the embodiments of the present invention are only a list of optimum effects achieved by the present invention. Hence, the effects of the present invention are not limited to those described in the embodiment of the present invention.

What is claimed is:

1. A connector unit comprising:
   a housing comprising a guide rail inside the housing;
   a terminal;
   a terminal block comprising a flange and configured to hold the terminal having one end exposed in an opening of the housing, the terminal block being housed inside the housing with the flange supported by the guide rail; and
   a board connected with a second end of the terminal and housed in the housing with the board suspended from the terminal block through the terminal;
   wherein the terminal block further comprises:
   a contact portion in contact with a mounting surface of the board; and
   a positioning protrusion protruding in parallel to the second end of the terminal from the contact portion and inserted into a positioning hole of the board at an insertion length longer than the second end of the terminal and such that a clearance is maintained between the positioning protrusion and the positioning hole at a position within the positioning hole in a direction perpendicular to a direction in which the board is inserted into the housing.

2. The connector unit according to claim 1, wherein the terminal block further comprises:
   a leg piece extending from the contact portion and contacting a place adjacent to a contact place of the contact portion on the mounting surface with the positioning protrusion inserted into the board.

3. The connector unit according to claim 1,
   wherein the flange of the terminal block is extended, in the direction perpendicular to the direction in which the board is inserted into the housing, from a first widthwise side of the terminal block to a second widthwise side of the terminal block opposite the first widthwise side,
   wherein the positioning protrusion is arranged at the first widthwise side, and
   wherein the terminal block further comprises a second positioning protrusion arranged at the second widthwise side and protruding in parallel to the second end of the terminal from the contact portion and inserted into a second positioning hole of the board at the insertion length longer than the second end of the terminal and such that a second clearance is maintained between the second positioning protrusion and the second positioning hole.

4. The connector unit according to claim 1,
   wherein the terminal block further comprises the positioning protrusion such that the clearance is maintained between the positioning protrusion and the positioning hole along a length of the positioning hole,
   wherein the length of the positioning hole comprises the position, and
   wherein an amount of the clearance is greater than another clearance between the contact portion and the mounting surface of the board.

5. The connector unit according to claim 1,
   wherein the clearance comprises space between a circumference of the positioning protrusion and the positioning hole, and
   wherein the positioning protrusion and the positioning hole are configured such that, in the positioning hole, the positioning protrusion is not in contact with any portion of the connector unit including the positioning hole.

6. The connector unit according to claim 1, wherein the terminal block is not directly fixed to the board.

* * * * *